US008630689B2

(12) United States Patent
Sennyu et al.

(10) Patent No.: US 8,630,689 B2
(45) Date of Patent: Jan. 14, 2014

(54) SUPERCONDUCTING ACCELERATOR CAVITY AND METHOD OF MANUFACTURING SUPERCONDUCTING ACCELERATOR CAVITY

(75) Inventors: Katsuya Sennyu, Tokyo (JP); Hiroshi Hara, Tokyo (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 13/637,105

(22) PCT Filed: May 10, 2011

(86) PCT No.: PCT/JP2011/060739

§ 371 (c)(1), (2), (4) Date: Sep. 25, 2012

(87) PCT Pub. No.: WO2011/142348

PCT Pub. Date: Nov. 17, 2011

(65) Prior Publication Data

US 2013/0012394 A1 Jan. 10, 2013

(30) Foreign Application Priority Data

May 12, 2010 (JP) ................................ 2010-110146

(51) Int. Cl.
*H01L 39/00* (2006.01)

(52) U.S. Cl.
USPC .......................................................... 505/200

(58) Field of Classification Search
USPC ............................... 505/200, 825; 228/173.4
See application file for complete search history.

(56) References Cited

U.S. PATENT DOCUMENTS

2012/0100994 A1* 4/2012 Sennyu ......................... 505/480

FOREIGN PATENT DOCUMENTS

| | | | |
|---|---|---|---|
| JP | 07-245199 | * | 9/1995 |
| JP | 7-245199 | | 9/1995 |
| JP | 2001-313200 | * | 11/2001 |
| JP | 3416249 | * | 6/2003 |

OTHER PUBLICATIONS

International Search Report issued Jul. 19, 2011 in corresponding International Application No. PCT/JP2011/060739.
Written Opinion of the International Searching Authority issued Jul. 19, 2011 in corresponding International Application No. PCT/JP2011/060739.
K. Watanabe et al., "New HOM coupler design for ILC superconducting cavity", Nuclear Instruments and Methods in Physics Research A, Jun. 30, 2008, vol. 595, No. 2, pp. 299-311.

* cited by examiner

*Primary Examiner* — Colleen Dunn
(74) *Attorney, Agent, or Firm* — Wenderoth, Lind & Ponack, L.L.P.

(57) ABSTRACT

Provided is a superconducting accelerator cavity and a method thereof with which product reliability can be enhanced and manufacturing costs can be reduced. A method of manufacturing a superconducting accelerator cavity includes a beam-pipe forming stage of forming a beam pipe by processing a superconducting material into a tube shape; an end-plate joining stage of joining, by welding, an inner circumferential surface of an end plate formed in a shape of a ring that forms an end of a jacket, which accommodates coolant, to an outer circumferential portion of an end in the beam pipe formed in the beam-pipe forming stage; and an end-cell joining stage of joining, by welding, an iris portion of an end cell, which is formed of a superconducting material in a shape of a ring so as to form a cavity portion, to an inner circumferential portion of the end of the beam pipe.

8 Claims, 4 Drawing Sheets

SUPERCONDUCTING ACCELERATOR CAVITY AND METHOD OF MANUFACTURING SUPERCONDUCTING ACCELERATOR CAVITY

TECHNICAL FIELD

The present invention relates to a superconducting accelerator cavity and a method of manufacturing a superconducting accelerator cavity.

BACKGROUND ART

A superconducting accelerator cavity accelerates charged particles that pass through the interior thereof. This superconducting accelerator cavity is formed by connecting beam pipes to ends of a cavity main body, which is a main body of the cavity, in which a plurality of cells with circular tube shapes having swollen center portions are combined. The cavity main body and the beam pipes are made of, for example, niobium, which is a superconducting material.

In order to maintain a superconducting state, at least the cavity main body needs to be kept in an extremely low-temperature state. Because of this, the area surrounding the cavity main body is generally surrounded by a titanium or stainless steel jacket, and the cavity main body is cooled to the extremely low-temperature state by accommodating, for example, liquid helium inside the jacket.

At this time, it is important to maintain airtightness at joints between the jacket and the superconducting accelerator cavity. Although the joints are conventionally joined by interposing gaskets therebetween or are joined by using brazing filler metals, this has not been enough to achieve sufficient airtightness.

As disclosed in Patent Literature 1, in order to achieve sufficient airtightness, it has been proposed to provide a niobium ring with protrusions, which has protruding portions over the entire circumference of an outer circumferential portion thereof, to join the titanium jacket to tips of the protruding portions by welding, followed by joining of the cavity main body and the beam pipes to both ends of the ring with the protrusions by welding.

CITATION LIST

Patent Literature

{PTL 1} Publication of Japanese Patent No. 3416249

SUMMARY OF INVENTION

Technical Problem

With the disclosure of Patent Literature 1, it is necessary to manufacture the ring with the protrusions as a member. In addition, there is a problem in that the manufacturing cost is increased because welding points occur at three locations when joining individual members.

Moreover, because welding at two locations, for joining the cavity main body and the beam pipes to both ends of the ring with protrusions, needs to be individually performed from an internal space, the welding directions are tilted to the joints, which makes it difficult to set the welding positions. Because this difficult welding is required at two locations, there is a problem in that the possibility of defective welding occurring due to displacement or the like is increased, and in that the reliability of the product is decreased.

The present invention has been conceived in light of the above-described circumstances, and an object thereof is to provide a superconducting accelerator cavity and a method of manufacturing a superconducting accelerator cavity with which product reliability can be enhanced and manufacturing cost can be reduced.

Solution to Problem

In order to solve the above-described problems, the present invention employs the following solutions.

Specifically, a first aspect of the present invention is a superconducting accelerator cavity including a beam pipe that is formed of a superconducting material in a tube shape with openings at both ends; an end plate that is formed in a shape of a ring so as to form an end of a jacket, which accommodates coolant, and that is joined, at an inner circumferential surface thereof, to an outer circumferential portion at one end of the beam pipe by welding; and an end cell that is formed of a superconducting material in a shape of a ring so as to form a superconducting accelerator cavity portion, which is a portion of the super conducting accelerator cavity, and that is joined, at an iris portion thereof, to an inner circumferential portion at one end of the beam pipe by welding.

With the superconducting accelerator cavity according to the first aspect of the present invention, the inner circumferential surface of the end plate that forms the end of the jacket is joined by welding to the outer circumferential portion at the one end of the beam pipe, which is formed in a tube shape with the openings at both ends, and the iris portion of the end cell is joined by welding to the inner circumferential portion at the one end of the beam pipe.

Because the end plate is joined with the beam pipe by welding in this way, sufficient airtightness can be maintained under any condition.

In addition, because the end cell is directly welded to the beam pipe, welding in which the welding direction is tilted to the joint is performed at one location. Therefore, because the probability of displacement or the like occurring can be reduced, the possiblity of defective welding can be reduced, and the product reliability can be enhanced.

Furthermore, because rings with protrusions are not required, the number of parts can be reduced. Accordingly, in combination with reduction in the number of processing steps due to the fewer welding locations, manufacturing costs can be reduced.

A second aspect of the present invention is a method of manufacturing a superconducting accelerator cavity including a beam-pipe forming stage of forming a beam pipe by processing a superconducting material into a tube shape; an end-plate joining stage of joining, by welding, an inner circumferential surface of an end plate formed in a shape of a ring that forms an end of a jacket, which accommodates coolant, to an outer circumferential portion at one end of the beam pipe formed in the beam-pipe forming stage; and an end-cell joining stage of joining, by welding, an iris portion of an end cell, which is formed of a superconducting material in a shape of a ring so as to form a superconducting accelerator cavity portion, to an inner circumferential portion at one end of the beam pipe.

With a method of manufacturing a superconducting accelerator cavity according to the second aspect of the present invention, the beam pipe is formed by processing a superconducting material into the tube shape in the beam-pipe forming stage. Subsequently, in the end-plate joining stage, the inner circumferential surface of the end plate formed in the shape of a ring so as to form the end of the jacket that accommodates coolant is joined by welding to the outer circumferential portion at the one end of the beam pipe. Then, in the end-cell joining stage, the iris portion of the end cell formed in the shape of a ring with a superconducting material so as to form the superconducting accelerator cavity portion is joined by welding to the inner circumferential portion at the one end of the beam pipe.

Because the end plate is joined by welding with the beam pipe in this way, sufficient airtightness can be maintained.

In addition, because the end cell is directly welded to the beam pipe, welding in which the welding direction is tilted to the joint is performed at one location. Therefore, because the probability of displacement or the like occurring can be reduced, the possibility of defective welding can be reduced and the product reliability can be enhanced.

Furthermore, because rings with protrusions are not required, the number of parts can be reduced. Accordingly, in combination with the reduction in the number of processing steps due to the fewer welding locations, manufacturing costs can be reduced.

With the second aspect of the present invention, the beam-pipe forming stage preferably includes a deep drawing stage of processing a plate material formed of a superconducting material into a bottom-capped tube shape by deep drawing processing; and a first machining stage of forming a tube shape body with openings at both ends thereof by removing a bottom portion of the bottom-capped tube shape, of adjusting dimensions thereof to predetermined dimensions, and also of processing an end-plate joint to which the end plate is joined at an outer circumferential portion at one end of the tube shape body.

With the second aspect of the present invention, a plate formed of a superconducting material is processed into the bottom-capped tube shape by being processed with deep drawing in the deep-drawing stage. Subsequently, in the first machining stage, the tube shape body that is open on both ends is formed by removing the bottom portion of the bottom-capped tube shape, the dimensions thereof are also adjusted to the predetermined dimensions, and thus, the end-plate joint to which the end plate is joined is processed at the outer circumferential portion of the one end of the tube shape body.

When the bottom-capped tube shape is formed by processing a plate material by deep drawing in the deep-drawing stage, the thickness of the tube tends to become smaller toward the bottom. In other words, the thickness of the tube of the end on the open side of the bottom-capped tube is larger than the thickness near the bottom thereof.

Because the thickness of the end plate is generally larger than the thickness of the beam pipe, when joining the inner circumferential surface of the end plate to the outer circumferential portion at the one end of the beam pipe by welding in the end-plate joining stage, there is a risk of a melted portion reaching an inner circumferential side of the beam pipe.

With the second aspect of the present invention, because the beam pipe is formed by deep drawing processing, the open side of the bottom-capped tube shape of the tube shape body can serve as the one end, which makes it possible to suppress the risk of a melted portion reaching the inner circumferential side of the beam pipe when joining the end plate.

In the first machining stage, a flange-joint, which joins an inner circumferential portion of an attachment flange to an outer circumferential portion at the other end of the tube shape body, may be processed in the first machining stage.

Because a linkage or attachment flange is generally attached, by welding, at the end (other end) of the beam pipe on the opposite side from the end cell, the flange-joint for attaching this flange may be processed in the first machining stage.

In this case, a flange joining stage of joining the flange to the flange-joint by welding may be provided between the first machining stage and the end-plate joining stage.

In addition, with the second aspect of the present invention, a second machining stage of processing a cell joint, which joins an iris portion of the end cell to an inner circumferential portion at one end of the tube shape body, may be provided before the end-cell joining stage.

By doing so, a superior cell joint, which is a joint portion of a cell, can be processed, even if, for example, deformation or the like occurs at the inner circumferential surface of the beam pipe due to joining of the end plate.

The cell joint may be processed in the first machining stage.

Advantageous Effects of Invention

With the present invention, because the inner circumferential surface of the end plate that forms the end of the jacket is joined by welding to the outer circumferential portion at the one end of the beam pipe formed in a tube shape having the openings at both ends, and because the iris portion of the end cell is joined by welding to the inner circumferential portion at one end of the beam pipe, the possibility of defective welding can be reduced, and the reliability of a superconducting accelerator cavity, which is a product, can be enhanced.

In addition, because the number of parts can be reduced, in combination with a reduction in the number of processing steps due to the fewer welding locations, manufacturing costs can be reduced.

DESCRIPTION OF EMBODIMENT

An embodiment of the present invention will be described below by using FIGS. 1 to 9.

Figure 1:
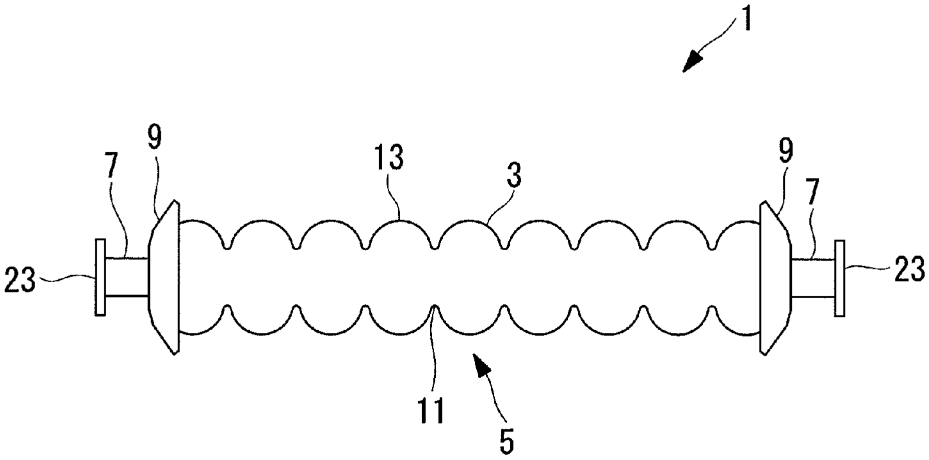
FIG. 1 is a front view of a superconducting accelerator cavity according to an embodiment of the present invention.

FIG. 1 is a front view of a superconducting accelerator cavity 1 according to the embodiment of the present invention.

As shown in FIG. 1, the superconducting accelerator cavity 1 is provided with a cavity portion (superconducting accelerator cavity portion) 5, in which, for example, nine cells 3 with circular tube shapes having swollen center portions are combined by welding, and a pair of beam pipes 7 that are attached at both ends of the cavity portion 5.

End plates 9 that form two ends of a jacket, which is a container formed so as to surround the cavity portion 5, are attached to the individual beam pipes 7 at the cavity portion 5 sides thereof.

Although illustrations thereof are omitted, the beam pipes 7 are provided with input ports to which input couplers are attached, higher-order-mode couplers that release higher order modes, which inhibit acceleration of beams excited in the cavity portion 5, outside the cavity portion 5, and so forth.

Iris portions 11, which are the narrowest portions formed between cells 3, are formed in the cavity portion 5. The cells 3 have the most-swollen portions at center portions thereof in an axial direction L. These most-swollen portions will be referred to as equator portions 13.

Figure 2:
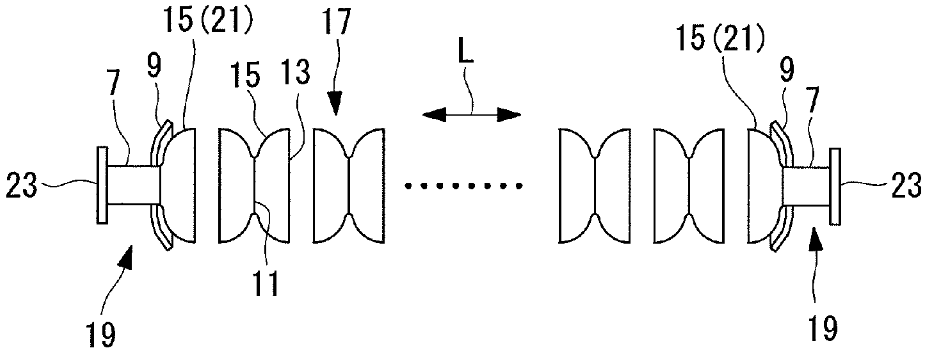
FIG. 2 is an explanatory diagram showing an example of a method of manufacturing the superconducting accelerator cavity in FIG. 1.

FIG. 2 is an explanatory diagram showing an example of a method of manufacturing the superconducting accelerator cavity 1 in FIG. 1. The method of manufacturing the superconducting accelerator cavity 1 will be described based on this.

First, the beam pipes 7, the end plates 9, and half cells 15 are manufactured as individual constituent members.

The half cells 15 are the cells 3 divided into two in the axial direction L with equator portions 13 serving as boundaries therebetween. The half cells 15 are formed by, for example, applying press molding to niobium-based material, which is a superconducting material.

A dumbbell 17 is formed by welding two half cells 15 so that the corresponding iris portions 11 are aligned with each other. For example, eight dumbbells 17 are manufactured.

Concurrently, two end parts 19 are manufactured. The end parts 19 are formed of the beam pipes 7, the end plates 9, and half cells 15. Because these half cells 15 form ends of the cavity portion 5, they will be hereinafter referred to as end cells 21.

The equator portion 13 at one end of a dumbbell 17 is joined with the equator portion 13 of the end cell 21 in one of the end parts 19 by welding. The next dumbbell 17 is joined to the other end of the joined dumbbell 17 by welding. The superconducting accelerator cavity 1 is formed by repeating this and by finally joining the other end part 19.

This is merely a description of an example of the method of manufacturing the superconducting accelerator cavity 1, and the superconducting accelerator cavity 1 can be manufactured by various methods without limitation thereto.

A method of manufacturing the end parts 19 and structures thereof will be specifically described below on the basis of FIGS. 3 to 8

Figure 5:
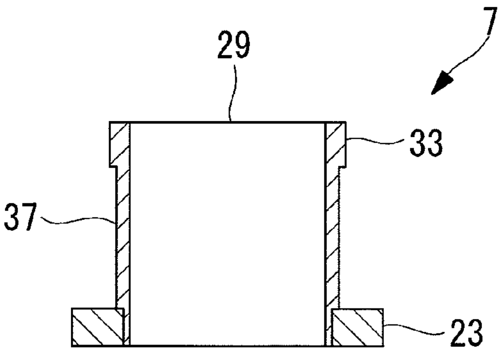
FIG. 5 is a cross-sectional view showing flange joining in the beam-pipe forming stage of the method of manufacturing the superconducting accelerator cavity according to the embodiment of the present invention.

As shown in FIG. 5, the beam pipe 7 is, for example, a hollow circular niobium tube member, and a flange 23 is provided at one end thereof. Although illustrations thereof are omitted, the beam pipe 7 is provided with an input port, an attaching portion for a higher-order-mode coupler, and so forth.

Figure 3:
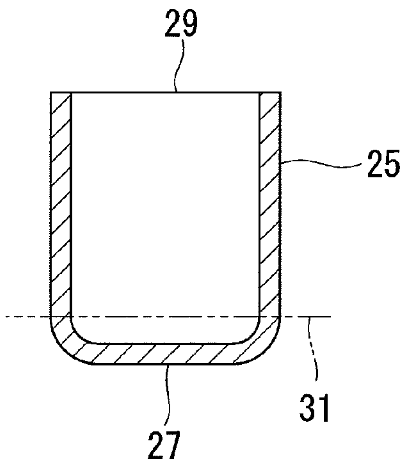
FIG. 3 is a cross-sectional view showing a state in which a metal plate is processed with deep drawing in a beam-pipe forming stage of the method of manufacturing the superconducting accelerator cavity according to the embodiment of the present invention.
Figure 4:
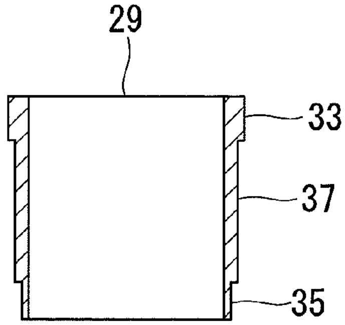
FIG. 4 is a cross-sectional view showing a state in which first machining has been performed in the beam-pipe forming stage of the method of manufacturing the superconducting accelerator cavity according to the embodiment of the present invention.

First, a beam-pipe forming stage of manufacturing the beam pipe 7 will be described. Raw blanks 25 shown in FIG. 3 are formed by processing niobium circular disks with a thickness of 3 to 6 mm by deep drawing (deep drawing stage). The raw blanks 25 have circular tube shapes (bottom-capped tube shapes) having bottom portions 27 and opening portions (one end) 29.

Next, a first machining stage is initiated. In the first machining stage, the first raw blank 25 is cut at a cutting position 31 shown in FIG. 3, thus forming a tube shape body from which the bottom portion 27 is removed.

Subsequently, a beam-pipe main body, which is a main body of a beam pipe, 37 is formed by processing the tube shape body so that the inside and outside diameters, thicknesses, and so forth have predetermined dimensions, and by processing an end-plate joint 33 at an outer circumferential portion of an end at the opening portion 29 side and a flange joint 35 at an outer circumferential portion of an end at the opposite side from the opening portion 29.

At this time, an input port, an attaching portion for a higher-order-mode coupler, and so forth may be processed in the beam-pipe main body 37.

As shown in FIG. 5, for example, the niobium titanium flange 23 is subsequently joined with the flange-joint 35 of the beam-pipe main body 37 by welding.

By doing so, manufacturing of the beam pipe 7 is completed.

Next, an end-plate joining stage of joining the end plates 9 with the beam pipes 7 is initiated. The end plates 9 form both ends of a helium jacket into which liquid helium is introduced, and the thicknesses of inner circumferential portions of, for example, titanium end plates 19 to be joined are, for example, 10 to 19 mm, which is several times greater than the thickness of the beam pipes 7.

Figure 6:
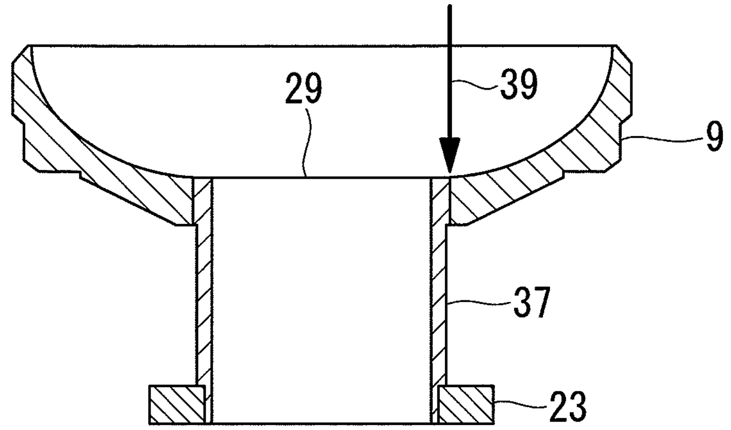
FIG. 6 is a cross-sectional view showing a state of an end-plate joining stage of the method of manufacturing the superconducting accelerator cavity according to the embodiment of the present invention.

As shown in FIG. 6, the end-plate joint 33 of the beam pipe 7 is aligned with an inner circumferential surface of the end plate 9 and is held thereat so as to form a welding groove. This welding groove is irradiated with, for example, a beam 39 to perform electron beam welding thereat, and thus the end plate 9 is joined to the beam pipe 7. The welding method is not limited to electron beam welding.

In addition, although the length of the end-plate joint 33 and the thickness of the end plate 9 are made substantially equal in this embodiment, they are not limited thereto. For example, if the length of the end-plate joint 33 is made longer than the thickness of the end plate 9 and, additionally, if a lower-side (opposite side with respect to the side on which the beam 39 is made incident) portion thereof is formed so as to protrude outward, because the end-plate joint 33 supports the end plate 9, stable, high-quality welding can be performed more easily.

Figure 7:
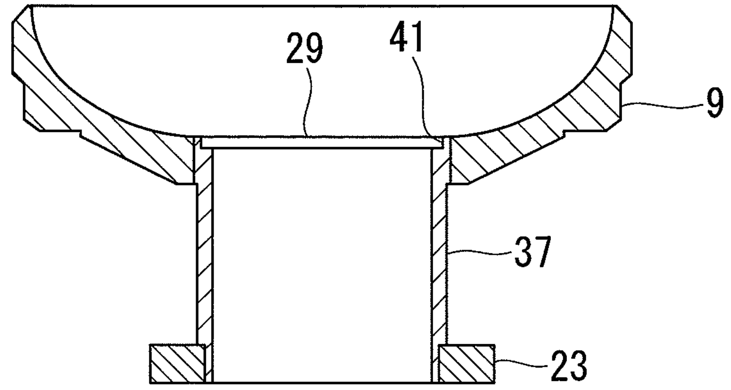
FIG. 7 is a cross-sectional view showing a state in which second machining has been performed in the method of manufacturing the superconducting accelerator cavity according to the embodiment of the present invention.

Next, as shown in FIG. 7, a cell joint, which is a joint portion of the cell, 41 to which the iris portion 11 of the end cell 21 is joined is processed (second machining stage) on the inner circumferential portion of the beam-pipe main body 37 at the end thereof at the opening portion 29 side.

If the cell joint 41 is processed after the end-plate joining stage in this way, superior cell joint 41 can be processed even if, for example, deformation or the like occurs at the inner circumferential surface of the beam pipe 7 by being joined with the end plate 9.

The cell joint 41 may be processed in the first machining stage described above.

Next, an end-cell joining stage of joining the end cell 21 to the beam pipe 7 is initiated.

Figure 8:
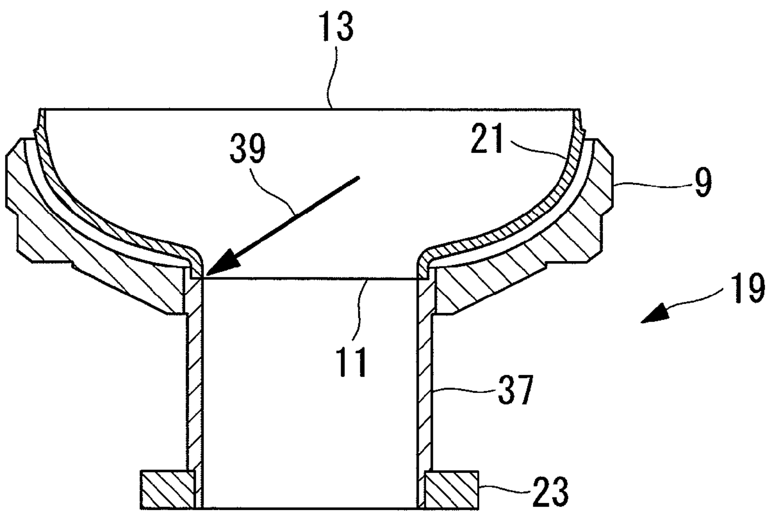
FIG. 8 is a cross-sectional view showing an end-cell joining stage of the method of manufacturing the superconducting accelerator cavity according to the embodiment of the present invention.

As shown in FIG. 8, the end cell 21 is kept so that the iris portion 11 thereof fits with the cell joint 41 of the beam pipe 7. The joint between the end cell 21 and the beam pipe 7 is irradiated with, for example, the beam 39 to perform electron beam welding thereat, thus joining the end plate 9 to the beam pipe 7. The welding method is not limited to electron beam welding.

At this time, because the beam 39 is radiated from the internal space of the end cell 21, the irradiation direction is tilted to the joint.

Figure 9:
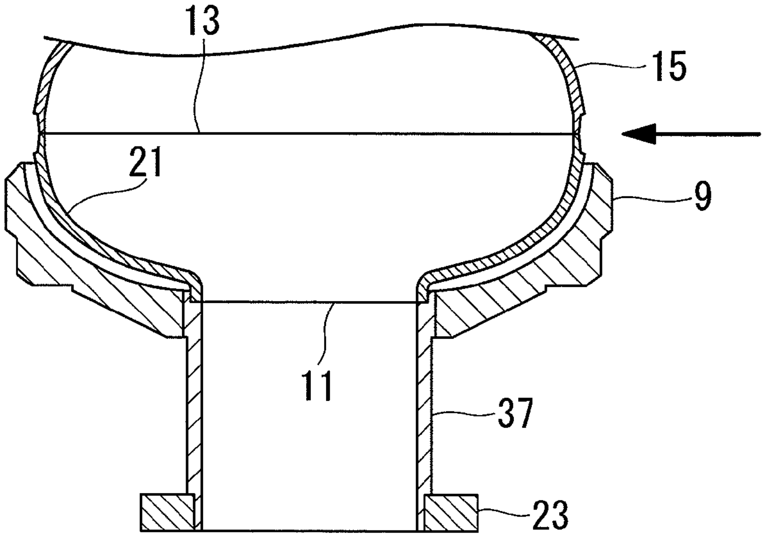
FIG. 9 is a cross-sectional view showing cavity-main-body joining in the method of manufacturing the superconducting accelerator cavity according to the embodiment of the present invention.

As shown in FIG. 9, the equator portion 13 of one of the half cells 15 in the dumbbell 17 is joined by welding to the equator portion 13 of the end cell 21 in the end part 19 formed in this way.

The superconducting accelerator cavity 1 is manufactured by joining the dumbbells 17 in succession as described above and by finally joining the other end part 19 thereto.

Because the end plate 19 is joined by welding at the outer circumferential portion of the beam pipe 7 in this way, sufficient airtightness can be maintained.

In addition, because the end cell 21 is directly welded to the beam pipe 7, welding in which the welding direction is tilted to the joint is performed at one location. Therefore, because the probability of displacement or the like occurring can be reduced as compared with methods in which this inclined welding is performed at two locations, the possibility of defective welding can be reduced, and the reliability of the superconducting accelerator cavity 1 can be enhanced.

Furthermore, because rings with protrusions that are conventionally employed to firmly join the end plates 9 by welding are not required, the number of parts can be reduced. Accordingly, in combination with reduction in the number of processing steps due to the fewer welding locations, manufacturing costs can be reduced.

The present invention is not limited to the above-described embodiment, and various modifications are possible within a range that does not depart from the spirit of the present invention.

For example, although the beam pipes 7 in this embodiment are processed into the tube shape by employing deep drawing processing, the method is not limited thereto. For example, the tube shape may be formed by bending rectangular plates and joining ends thereof by welding.

REFERENCE SIGNS LIST

1 superconducting accelerator cavity
5 cavity portion
7 beam pipe
9 end plate
11 iris portion
21 end cell
23 flange
33 end-plate joint
35 flange joint
37 beam-pipe main body
41 cell joint

The invention claimed is:

1. A superconducting accelerator cavity comprising:

a beam pipe that is formed of a superconducting material in a tube shape with openings at both ends;

an end plate that is formed in a shape of a ring so as to form an end of a jacket, which accommodates coolant, and that is joined, at an inner circumferential surface thereof, to an outer circumferential portion at one end of the beam pipe by welding; and an end cell that is formed of a superconducting material in a shape of a ring so as to form a superconducting accelerator cavity portion and that is joined, at an iris portion thereof, to an inner circumferential portion at one end of the beam pipe by welding.

2. A method of manufacturing a superconducting accelerator cavity comprising:

a beam-pipe forming stage of forming a beam pipe by processing a superconducting material into a tube shape;

an end-plate joining stage of joining, by welding, an inner circumferential surface of an end plate formed in a shape of a ring that forms an end of a jacket, which accommodates coolant, to an outer circumferential portion at one end of the beam pipe formed in the beam-pipe forming stage; and an end-cell joining stage of joining, by welding, an iris portion of an end cell, which is formed of a superconducting material in the shape of a ring so as to form a superconducting accelerator cavity portion, to an inner circumferential portion at one end of the beam pipe.

3. A method of manufacturing a superconducting accelerator cavity according to claim 2, wherein the beam-pipe forming stage includes a deep drawing stage of processing a plate material formed of a superconducting material into a bottom-capped tube shape by deep drawing processing; and a first machining stage of forming a tube shape body with openings at both ends thereof by removing a bottom portion of the bottom-capped tube shape, of adjusting dimensions thereof to predetermined dimensions, and also of processing an end-plate joint to which the end plate is joined at an outer circumferential portion at one end of the tube shape body.

4. A method of manufacturing a superconducting accelerator cavity according to claim 3, wherein a flange-joint, which joins an inner circumferential portion of an attachment flange to an outer circumferential portion at the other end of the tube shape body, is processed in the first machining stage.

5. A method of manufacturing a superconducting accelerator cavity according to claim 4, further comprising, between the first machining stage and the end-plate joining stage, a flange joining stage of joining the flange to the flange joint by welding.

6. A method of manufacturing a superconducting accelerator cavity according to claim 3, further comprising, before the end-cell joining stage, a second machining stage of processing a cell joint which joins an iris portion of the end cell to an inner circumferential portion at one end of the tube shape body.

7. A method of manufacturing a superconducting accelerator cavity according to claim 4, further comprising, before the end-cell joining stage, a second machining stage of processing a cell joint which joins an iris portion of the end cell to an inner circumferential portion at one end of the tube shape body.

8. A method of manufacturing a superconducting accelerator cavity according to claim 5, further comprising, before the end-cell joining stage, a second machining stage of processing a cell joint which joins an iris portion of the end cell to an inner circumferential portion at one end of the tube shape body.

* * * * *